(12) United States Patent
Tian

(10) Patent No.: US 9,356,629 B2
(45) Date of Patent: *May 31, 2016

(54) METHOD AND APPARATUS FOR IMPROVING TRANSMISSION OF DATA ON A BANDWIDTH EXPANDED CHANNEL

(71) Applicant: AT&T Intellectual Property I, L.P., Atlanta, GA (US)

(72) Inventor: Chao Tian, Madison, NJ (US)

(73) Assignee: AT&T Intellectual Property I, L.P., Atlanta, GA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/330,746

(22) Filed: Jul. 14, 2014

(65) Prior Publication Data

US 2014/0328432 A1    Nov. 6, 2014

Related U.S. Application Data

(63) Continuation of application No. 13/286,445, filed on Nov. 1, 2011, now Pat. No. 8,781,023.

(51) Int. Cl.
*H04L 27/00* (2006.01)
*H04B 1/04* (2006.01)
*H04L 25/14* (2006.01)

(52) U.S. Cl.
CPC ............ *H04B 1/04* (2013.01); *H04B 1/0475* (2013.01); *H04L 25/14* (2013.01); *H04B 2001/0408* (2013.01)

(58) Field of Classification Search
CPC ......... H04L 27/362; H04L 5/00; H04L 15/00; H04L 17/00; H04B 1/00; H04B 3/00; H04B 5/00; H04B 7/00; H04B 10/00; H04B 13/00; H04B 14/00

USPC ................................. 375/295, 262, 240.11
See application file for complete search history.

(56) References Cited

U.S. PATENT DOCUMENTS

| | | | |
|---|---|---|---|
| 5,586,024 A | 12/1996 | Shaibani | |
| 5,588,024 A | 12/1996 | Takano | |
| 5,625,743 A | 4/1997 | Fiocca | |
| 6,021,385 A | 2/2000 | Jarvinen et al. | |
| 6,104,996 A | 8/2000 | Yin | |
| 6,349,284 B1 | 2/2002 | Park et al. | |
| 6,362,760 B2 | 3/2002 | Kober et al. | |
| 6,487,535 B1* | 11/2002 | Smyth et al. | .................. 704/500 |
| 6,604,069 B1 | 8/2003 | Tsutsui | |
| 6,725,192 B1 | 4/2004 | Araki | |
| 6,950,794 B1 | 9/2005 | Subramaniam et al. | |
| 7,047,187 B2 | 5/2006 | Cheng et al. | |
| 7,409,350 B2 | 8/2008 | Hsu | |
| 8,774,308 B2* | 7/2014 | Tian | .............................. 375/295 |
| 8,781,023 B2* | 7/2014 | Tian | .............................. 375/295 |
| 8,798,184 B2* | 8/2014 | Su | ........................ H04B 7/0617 375/260 |
| 9,210,002 B2* | 12/2015 | Oh | ....................... H04L 25/0224 |
| 2004/0064310 A1 | 4/2004 | Banba et al. | |

(Continued)

*Primary Examiner* — Emmanuel Bayard

(57) ABSTRACT

A method and apparatus for providing transmission of data on a channel in a network. For example, the method determines a ratio of a number of channel uses of the channel to a number of source samples, divides a channel bandwidth into a plurality of subbands of equal bandwidth in accordance with the ratio, receives a source sample block, determines a channel input for each of the plurality of subbands from the source sample block in accordance with a hybrid coding scheme, and transmits, for each of the plurality of subbands, the channel input that is determined over the network.

9 Claims, 4 Drawing Sheets

(56) References Cited

U.S. PATENT DOCUMENTS

| | | |
|---|---|---|
| 2004/0081075 A1 | 4/2004 | Tsukakoshi |
| 2004/0125878 A1 | 7/2004 | Liljeryd et al. |
| 2005/0043830 A1 | 2/2005 | Lee et al. |
| 2005/0065792 A1 | 3/2005 | Gao |
| 2005/0207505 A1 | 9/2005 | Lakkis |
| 2005/0271367 A1 | 12/2005 | Lee et al. |
| 2006/0018365 A1 | 1/2006 | Jung et al. |
| 2006/0147124 A1 | 7/2006 | Edler et al. |
| 2007/0244699 A1 | 10/2007 | Mogi et al. |
| 2009/0132238 A1 | 5/2009 | Sudhakar |
| 2010/0223311 A1 | 9/2010 | Sugiyama |
| 2011/0280232 A1 | 11/2011 | Wu et al. |
| 2011/0280332 A1 | 11/2011 | Yonge, III |
| 2012/0008559 A1 | 1/2012 | Leung |
| 2012/0063354 A1 | 3/2012 | Vanga et al. |
| 2012/0063554 A1 | 3/2012 | Smith |
| 2012/0088559 A1 | 4/2012 | McSweyn et al. |
| 2013/0107979 A1 | 5/2013 | Tian |
| 2013/0107986 A1 | 5/2013 | Tian |
| 2014/0156287 A1* | 6/2014 | Koishida et al. ............... 704/500 |
| 2014/0298145 A1* | 10/2014 | Tian ............................... 714/776 |
| 2014/0328432 A1 | 11/2014 | Tian |

* cited by examiner

METHOD AND APPARATUS FOR IMPROVING TRANSMISSION OF DATA ON A BANDWIDTH EXPANDED CHANNEL

This application is a continuation of U.S. patent application Ser. No. 13/286,445, filed Nov. 1, 2011, now U.S. Pat. No. 8,781,023, which is herein incorporated by reference in its entirety.

The present disclosure relates generally to data transmission on a communication network and, more particularly, to a method and apparatus for improving data transmission on a bandwidth mismatched channel in a network, e.g., a wireless network.

BACKGROUND

Digital coding schemes based on source-channel separation principle are sensitive to channel condition. If the channel condition is worse than what a code is designed for, the decoder fails to completely decode a code that has traversed the channel. On the other hand, if the channel condition is better than what the code is designed for, the code fails to provide any performance improvement. Thus, the digital coding scheme suffers from a threshold effect.

One approach is to design the coding scheme to achieve an optimal performance for a given channel condition. However, the resulting code offers performance improvement either when the channel condition is worse or when the channel condition is better, but not both.

SUMMARY

In one embodiment, the present disclosure provides a method and an apparatus for providing transmission of data on a channel in a network, e.g., a wireless network. For example, the method determines a ratio of a number of channel uses of the channel to a number of source samples, divides a channel bandwidth into a plurality of subbands of equal bandwidth in accordance with the ratio, receives a source sample block, determines a channel input for each of the plurality of subbands from the source sample block in accordance with a hybrid coding scheme, and transmits, for each of the plurality of subbands, the channel input that is determined over the network.

BRIEF DESCRIPTION OF THE DRAWINGS

The teaching of the present disclosure can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present disclosure broadly describes a method and apparatus for improving the transmission of data on a bandwidth mismatched channel in a network, e.g., a wireless network and the like. Although the teachings of the present disclosure are discussed below in the context of wireless networks, the teaching is not so limited. Namely, the teachings of the present disclosure can be applied for other types of networks, wire-based networks, etc.

Digital communication systems have been widely deployed in modern communication networks. However, these digital communications systems are based on Shannon's source-channel separation principle. Digital coding schemes based on source-channel separation principle are sensitive to channel conditions. For example, a code may be designed for a specific channel condition. However, if the channel condition is worse than what the code is designed for, the decoder may fail to completely decode a code that has traversed the channel. In another scenario, if the channel condition is better than what the code is designed for, the code may fail to provide any performance improvement. Thus, the digital coding scheme based on source-channel separation principle suffers from a threshold effect.

In one embodiment, the present disclosure provides a hybrid analog and digital coding scheme that is capable of improving decoding performance when the channel condition is worse and when the channel condition is better, simultaneously. The hybrid analog and digital coding scheme is also referred to as a hybrid coding scheme. Namely, the coding scheme of the present disclosure is able to achieve a performance improvement for both the better and the worse channel conditions, while keeping the performance optimal for a given target channel condition.

Figure 1:
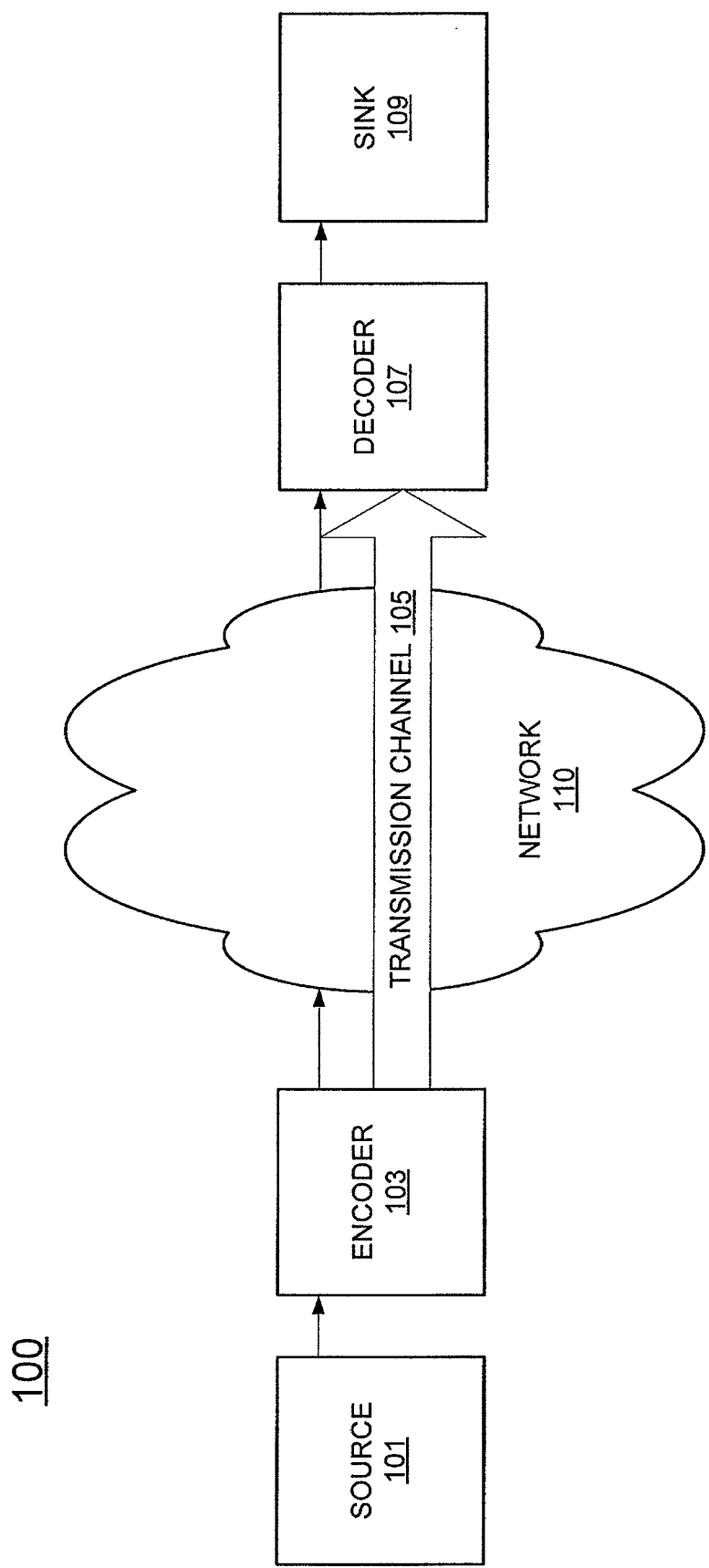
FIG. 1 illustrates an exemplary transmission system related to the present disclosure.

FIG. 1 illustrates an exemplary transmission system 100 related to the present disclosure. The transmission system 100 comprises a source 101 (broadly a data source), an encoder 103, a transmission channel 105, a decoder 107, and a sink 109 (broadly a data destination). The transmission channel 105 traversed the network 110. The network 110 comprises a wireless network. It should be noted that each of the modules discussed above in the transmission system 100 may be implemented in one or more hardware devices, e.g., one or more hardware computing devices having one or more processors and the like.

In one embodiment, the source 101 transmits samples (e.g., broadly data samples) to the encoder 103. The encoder 103 performs the coding, i.e., applying a coding to the received samples. The resulting (encoded) output of the encoder is then transmitted to the decoder 107 via the transmission channel 105. The decoder 107 performs reconstruction of the source samples and forwards the decoded samples to the sink 109. It should be noted that the transmission system 100 may comprise many other network elements (not shown), e.g., transmitters, receivers, base stations, routers, switches, gateways, and the like.

The problem of providing transmission of data on a bandwidth mismatched channel may be formulated as a lossy source broadcast problem with two users. In one embodiment, the source and the additive noise of the channel are both Gaussian. The measure used to evaluate the performance of a code is the reconstruction mean squared error. In order to more clearly illustrate the problem, the source and channel conditions are mathematically defined as follows:

First, the source is a memoryless zero-mean Gaussian source with unit variance $S \sim \mathcal{N}(0,1)$. Similarly, the channel is a memoryless channel given by: $Y = X + \mathbb{N}$, wherein X is the channel input subject to an average power constraint P, and Ñ ~ $\mathcal{N}$ (0, N) is a memoryless additive Gaussian noise. Then, the transmission signal to noise ratio (P/N) is denoted by SNR.

In order to clearly illustrate the teachings of the current disclosure, the concept of channel use is introduced. Channel use refers to a channel's ability to transmit a sample. For example, if there are ten source samples generated per second and there are thirty channel uses per second, then there are three channel uses available for transmitting each source sample. If one channel use is available per source sample, the source bandwidth and the channel bandwidth are said to be matched. If the source bandwidth and the channel bandwidth are matched, a linear scaling of the source sample provides an optimal performance.

However, when the source bandwidth and the channel bandwidth are not matched, there are no known methods that provide a complete characterization for both worse and better channel conditions, simultaneously. The present disclosure provides a hybrid coding scheme for transmitting on a bandwidth mismatched channel that provides performance improvement for both worse and better channel conditions.

First consider two other receivers—a receiver with a worse channel condition and another receiver with a better channel condition. The receiver with a worse channel condition has a transmission signal to noise ratio of $SNR^+$ and the receiver with a better channel condition has a transmission signal to noise ratio of $SNR^-$. Hence, $SNR^+ \geq SNR$ and $SNR^- \leq SNR$. The channel output for the channel with the worse channel condition is denoted by $Y^+$. The channel output for the channel with the better channel condition is denoted by $Y^-$.

For example, if there are three users and the users are designated as a good user, a median user and a bad user, the respective transmission signal to noise ratios for the three users may be designated by $SNR^+$, $SNR$, and $SNR^-$, respectively.

The bandwidth of the source (source bandwidth) and the bandwidth of the channel (channel bandwidth) may not be matched. For example, for each m source samples, a total of n channel uses may be available. The ratio of the number of channel uses to the number of source samples is referred to as a bandwidth expansion factor. The bandwidth expansion factor is defined as:

$$b \triangleq \frac{n}{m}.$$

If b<1, the bandwidth is said to be compressed. If b>1, the bandwidth is said to be expanded. If b=1, the bandwidth is said to be matched.

Using Shannon's source channel separation theorem, while ignoring all other receivers, the optimal distortion for a receiver with transmission signal to noise ratio of SNR is given by:

$$D^*(SNR) = D\left(\frac{n}{m}C\right) = D(bC),$$

wherein D(R) is a Gaussian distortion rate function and C is a Gaussian channel capacity per channel use. The Gaussian channel capacity per channel use may also be referred to as simply as a Gaussian channel capacity.

Then, substituting for the Gaussian distortion-rate function and the Gaussian channel capacity, the optimal distortion (described above) may be determined as follows: $D^*(SNR)= \exp(-b \log(1+SNR))=(1+SNR)^{-b}$, wherein the natural logarithm function (log) is used.

For the case in which the bandwidth is expanded (i.e. b>1), a method described by Reznic, Feder and Zamir may achieve an improved distortion behavior for either a receiver with worse channel condition or better channel condition—but not both.

For example, for the channel conditions $SNR^-$, SNR and $SNR^+$, respectively, Reznic, Feder and Zamir may achieve either a distortion triple $(D^\dagger(SNR^-), D^*(SNR), D^*(SNR))$ or a distortion triple $(D'(SNR^-), D^*(SNR), D^\dagger(SNR^+))$, wherein $$D^\dagger(SNR^+) = \frac{1}{(1+SNR)^{b-1}(1+SNR^+)},$$

$$D^\dagger(SNR^-) = \frac{1}{(1+SNR^-)},$$

and $$D'(SNR^-) = 1 - \frac{SNR^-}{(1+SNR)^{b-1}(1+SNR^-)}.$$

However, the Reznic, Feder and Zamir method does not achieve improved distortion behavior for both worse and better channel conditions, simultaneously. Note that $D^\dagger$ has greater performance gain over $D^*$ as compared to the performance gain of $D'$ over the $D^*$. In order to achieve the $D^\dagger(SNR^-)$ for the bad user, Reznic, Feder and Zamir cannot provide any performance gain for the good user over the performance of the median user. Similarly, in order to achieve $D^\dagger(SNR^+)$ for the good user, Reznic, Feder and Zamir can only achieve minimal distortion reduction for the bad user over the median user.

For the case in which the bandwidth is compressed (i.e. b<1), a method described by Prabhakaran may be used to achieve an improved distortion behavior for either a receiver with worse channel condition or a receiver with a better channel condition—but not both.

For example, for the channel conditions $SNR^-$, SNR and $SNR^+$, respectively, Prabhakaran may achieve either a distortion triple $(D^\dagger(SNR^-), D^*(SNR), D^*(SNR))$ or a distortion triple $(D'(SNR^-), D^*(SNR), D^\dagger(SNR^+))$, wherein, $$D^\dagger(SNR^+) = (1-b)D^*(SNR) + b\frac{SNR}{(1+SNR)^b SNR^+ + SNR - SNR^+},$$

$$D^\dagger(SNR^-) = 1 - bSNR\frac{1+SNR - (1+SNR)^{1-b}}{SNR(1+SNR^-)},$$

and $$D'(SNR^-) = 1 - bSNR\frac{(1+SNR)^b - 1}{SNR(1+SNR^-)},$$

but not both.

In both the Reznic, Feder and Zamir and the Prabhakaran approaches (described above), $D'(SNR^-) \geq D^\dagger(SNR^-)$. A coding scheme used for the above bandwidth expansion and bandwidth compression examples is a coding scheme designed for sending a Gaussian source on a Gaussian channel, wherein the bandwidth is matched (i.e. b=1), and a side information is available at the receiver but not at the transmitter. The coding scheme is referred to as a hybrid joint source channel Wyner-Ziv coding scheme. In order to use the hybrid joint source channel Wyner-Ziv coding scheme, first let $S_d$ represent the side information, Z represent a Gaussian random variable independent of $S_d$, and S represent the source. Then, $S=S_d+Z$. The coding scheme then operates as follows:

First, a set of codewords may be generated by an encoder according to a distribution $U=X+\kappa S$, wherein X is a Gaussian random variable independent of the source S. The objective of the encoder is to find a codeword $u^m$ such that the codeword is jointly typical with a source sequence $S^m$. The encoder then transmits $u^m-\kappa S^m$ on the channel. A decoder receives a channel output $Y^m$. A side information $S_d^m$ is available at the receiver. The decoder uses $Y^m$, $S_d^m$ and joint typicality for decoding. When the rate of the codebook is chosen such that $I(U; S_d, Y) > R > I(U;S)$, then the codeword is correctly decoded. The source estimate is formed using $S_d$, U, Y jointly. In order to achieve an optimal performance for the channel condition of SNR, an appropriate value is chosen for $\kappa$.

It is important to note that other coding schemes may be used. For example, an encoder may use a distribution $U=X+\alpha T+\kappa S$, wherein T is a channel state. The encoder may then transmit the resulting X vector, $u^m-\alpha T^m-\kappa S^m$, on the channel. If the rate of the generated U codebook is chosen such that $I(U; Y) > R > I(U;T,S)$, the codeword is correctly decoded and the source estimate is formed by using Y, U jointly.

The present disclosure provides a hybrid coding scheme that achieves the distortion triple $(D^\dagger(SNR^-), D^*(SNR), D^\dagger(SNR^+))$ for the channel conditions $SNR^-$, SNR and $SNR^+$, respectively, wherein the bandwidth of the channel is expanded.

In one embodiment, the bandwidth expansion factor for the channel has an integer value. For example, the bandwidth expansion factor, $$b \triangleq \frac{n}{m},$$

for the channel is an integer such that b>1.

In one embodiment, the coding scheme of the present disclosure is based on recursive quantization. When the bandwidth expansion factor has an integer value greater than one, the method first breaks the channel bandwidth evenly into b portions, each portion having m channel uses. Each of the resulting portions (having m channel uses) is referred to as a subband of the channel. For example, if there are four source samples and a total of twelve channel uses, b is then equal to three. Then, the method breaks the channel bandwidth into three subbands, with each of the three subbands having four channel uses.

In one embodiment, the method then digitally quantizes the source with a Gaussian codebook. The method then properly scales the quantized source to satisfy power constraints with equality. The quantized source is scaled such that the scaled version of the quantized source has a power level that matches the power level of the channel. The method then uses the resulting scaled and quantized source as the channel input for the first subband.

In one embodiment, the method then proceeds to determine the channel input for the second subband. The channel input for the second subband is based on the source quantization noise from the coding performed for transmitting in the first subband. Thus, the method determines the source quantization noise for the first subband. For example, the method determines the source quantization noise as the difference between the source and the quantized source derived above for the first subband. The method then digitally quantizes the determined source quantization noise using a Gaussian codebook. The method then scales the quantized version to use as the channel input for the second subband.

The method recursively continues until the channel input for the (b−1)-th subband is determined by quantizing and appropriately scaling the quantization noise from the coding performed for the (b−2)-th subband.

For the last subband (b-th subband), the method directly scales the quantization noise from the codeword of the (b−1)-th subband and uses the scaled (uncoded) quantization noise as an input for the last subband. The channel input for the last subband is then derived without further quantization of the quantization noise from the previous (i.e. (b−1)-th) subband.

In one embodiment, the quantization and channel coding rate for each of the subbands 1, 2, . . . , b−1 is $R=\frac{1}{2}\log(1+SNR)$. Noting that the Gaussian source is successively refinable, the present method achieves optimal results for the median user and also achieves $D^\dagger(SNR^+)$ for the good user.

In order to illustrate that $D^\dagger(SNR^-)$ is achieved for the bad user, the $D(SNR^-)$ is derived as follows. The channel quality of $SNR^-$ is not sufficient for the codewords of the bad user to be decoded reliably. However, for each subband, the method of the present disclosure is able to extract information to estimate the source. As described above, each subband encodes the quantization noise from the previous subband.

Denoting the quantization noises for the subbands 1, 2, . . . , b−1 by $S_1, S_2, \ldots, S_{b-1}$ and their respective quantized versions by $\hat{S}_1, \hat{S}_2, \ldots, \hat{S}_{b-1}$, then $S=S_1-\hat{S}_1+\hat{S}_1=S_2+\hat{S}_1= \ldots =\sum_{i=1}^{b}\hat{S}_i$, wherein $S_1=S$. For convenience, the method also defines $\hat{S}_b=S_b$. Since Gaussian codebooks are used, the terms $\hat{S}_1, \hat{S}_2, \ldots, \hat{S}_b$ are mutually independent. The Gaussian sources are successively refinable. Hence, the variance for each $S_i$ is given by $\text{Var}(S_i)=(1+SNR)^{i-1}$, for i=1, 2, . . . , b, wherein Var(.) is the variance of the random variable.

The i-th subband encodes the i-th quantization noise independent of other noises and subbands. Thus, for the bad user, the channel observation on the i-th subband is $\tilde{S}_i$. The estimate of $\hat{S}_i$ may then be formed as: $S(SNR^-)=\sum_{i=1}^{b} \mathbb{E}(\hat{S}_i|\tilde{S}_i)$.

Then, $D(SNR^-)=\mathbb{E}(S-S(SNR^-))^2=\sum_{i=1}^{b}\mathbb{E}[\hat{S}_i-\mathbb{E}(\hat{S}_i|\tilde{S}_i)]^2$. Since a Gaussian codebook is used, the choice of the channel coding rates gives: $I(S_i;\hat{S}_i)=\frac{1}{2}\log(1+SNR)$ for i=1, 2, . . . , b−1. Then, for the variances, $$\text{Var}(\hat{S}_i) = \frac{SNR}{(1+SNR)^i}$$

for i=1, 2, . . . , b−1.

Then, $\hat{S}_i$ may be taken as a fictitious source that is transmitted on a bandwidth matched system un-coded. Thus, $$\mathbb{E}\left[\hat{S}_i - \mathbb{E}(\hat{S}_i | \tilde{S}_i)\right]^2 = \text{Var}(\hat{S}_i)\frac{1}{1+SNR^-} = \frac{SNR}{(1+SNR)^i(1+SNR^-)},$$

for i=1, 2, . . . , b−1.

For the last subband, $\hat{S}_b=S_b$, and $$\mathbb{E}\left[\hat{S}_b - \mathbb{E}(\hat{S}_b | \tilde{S}_b)\right]^2 = \text{Var}(\hat{S}_b)\frac{1}{1+SNR^-} = \frac{1}{(1+SNR)^{b-1}(1+SNR^-)}.$$

Combining the above results, $$D(SNR^-) = \left(\sum_{i=1}^{b} \frac{SNR}{(1+SNR)^i(1+SNR^-)}\right) + \frac{1}{(1+SNR)^{b-1}(1+SNR^-)}.$$

Then, $$D(SNR^-) = \frac{1}{1+SNR^-} = D^\dagger(SNR^-).$$

Thus, for the integer bandwidth expansion case, the distortion triple $(D^\dagger(SNR^-), D^*(SNR), D^\dagger(SNR^+))$ for the channel conditions $SNR^-$, $SNR$ and $SNR^+$, respectively, is achieved.

In another embodiment, the bandwidth expansion factor may have fractional value. If the bandwidth expansion factor has a fractional value, the method may encode for transmission on the integer portions of the channel uses as described above. In one embodiment, for the fractional portion of the channel use, the method may perform digital compression to fit the sample in the fractional portion of the channel use. In one embodiment, for the fractional portion of the channel use, the method may simply not transmit the source. For example, if there are 2.2 channel uses for each source sample, the method may transmit on two channel uses and ignore the 0.2 portion. In another example, the method may send a compressed version of the sample on the remaining bandwidth (on the remaining 0.2 channel uses). It should be noted that there may be other encoding techniques that can be used to fill the fractional portions of the leftover channel bandwidth.

Figure 2:
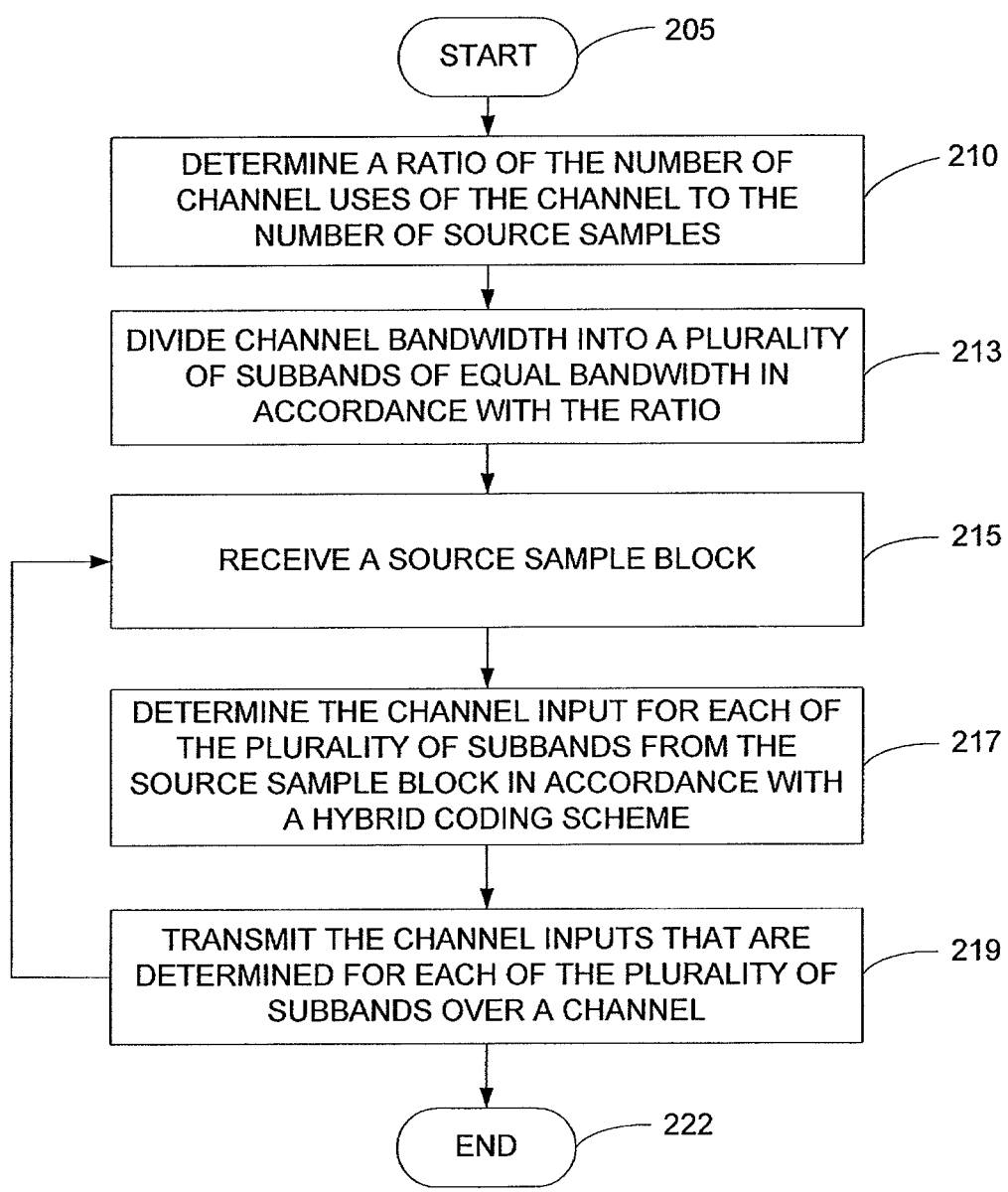
FIG. 2 illustrates a flow chart of a method for providing transmission of data on a channel in a network, wherein a ratio of a number of channel uses of the channel to a number of sources samples is an integer value greater than one.

FIG. 2 illustrates a flow chart of a method 200 for providing transmission of data on a channel in a wireless network, wherein a ratio of a number of channel uses of the channel to a number of source samples is an integer value, e.g., greater than one. In one embodiment, one or more steps of method 200 are implemented by an encoder used in a transmission system, e.g., a transmission system used in a wireless network. Method 200 starts in step 205 and proceeds to step 210.

In step 210, method 200 determines a ratio of the number of channel uses of the channel to the number of source samples. For example, for a particular channel, if the number of source samples is m and the number of channel uses is n, the ratio of the number of channel uses of the channel to the number of source samples is determined as:

$$b \triangleq \frac{n}{m}.$$

In step 213, method 200 breaks or divides the channel bandwidth into a plurality of subbands of equal bandwidth. For example, the method breaks the channel bandwidth in accordance with the ratio of the number of channel uses of the channel to the number of source samples as described above, i.e., into b subbands of equal bandwidth, with each of the b subbands comprising m channel uses. For example, if m=4 and n=12, then b=3. Then, the channel bandwidth of the particular channel is evenly divided into 3 subbands, with each subband comprising 4 channel uses. The method then proceeds to determine the channel input for each of the plurality of subbands.

In step 215, method 200 receives a source sample block. For example, method 200 receives source sample block comprising m source samples to be encoded and transmitted across the network.

In step 217, method 200 determines the channel input for each of the plurality of subbands from the source sample block in accordance with a hybrid coding scheme. For example, for each of the subbands 1, 2, . . . , b, the method determines the channel input recursively in accordance with the hybrid analog and digital coding scheme of the present disclosure. In one embodiment, FIG. 3 illustrates a flowchart of a method for determining of the channel input for each of the plurality of subbands in accordance with the hybrid coding scheme.

Note that the channel input for the first subband is based on quantizing the source sample block. The channel input for the second subband is based on quantizing the quantization noise from the coding performed for transmitting in the first subband. The channel input for the third subband is based on quantizing the quantization noise from the coding performed for transmitting in the second subband. The process continues until the channel input for the (b−1)-th subband is determined by quantizing the quantization noise from the coding performed for the (b−2)-th subband. The channel input for the last subband is determined from the quantization noise from the coding performed for the (b−1)-th subband without further quantization. That is, for the last subband, the channel input is determined by scaling the quantization noise of the previous subband without performing further quantization. It should be noted that scaling is performed to satisfy a power constraint with equality.

In step 219, method 200 transmits the channel inputs that are determined for each of the plurality of subbands over the channel. For example, the channel inputs determined in step 217 for the subbands 1, 2, . . . , b are transmitted towards a decoder over the network. The decoder may then reconstruct the source sample block. For example, the decoder may use a linear mean square estimation technique for reconstructing the source sample block. The method either proceeds to step 215 to continue receiving source sample blocks or to step 222 to end the current process.

Figure 3:
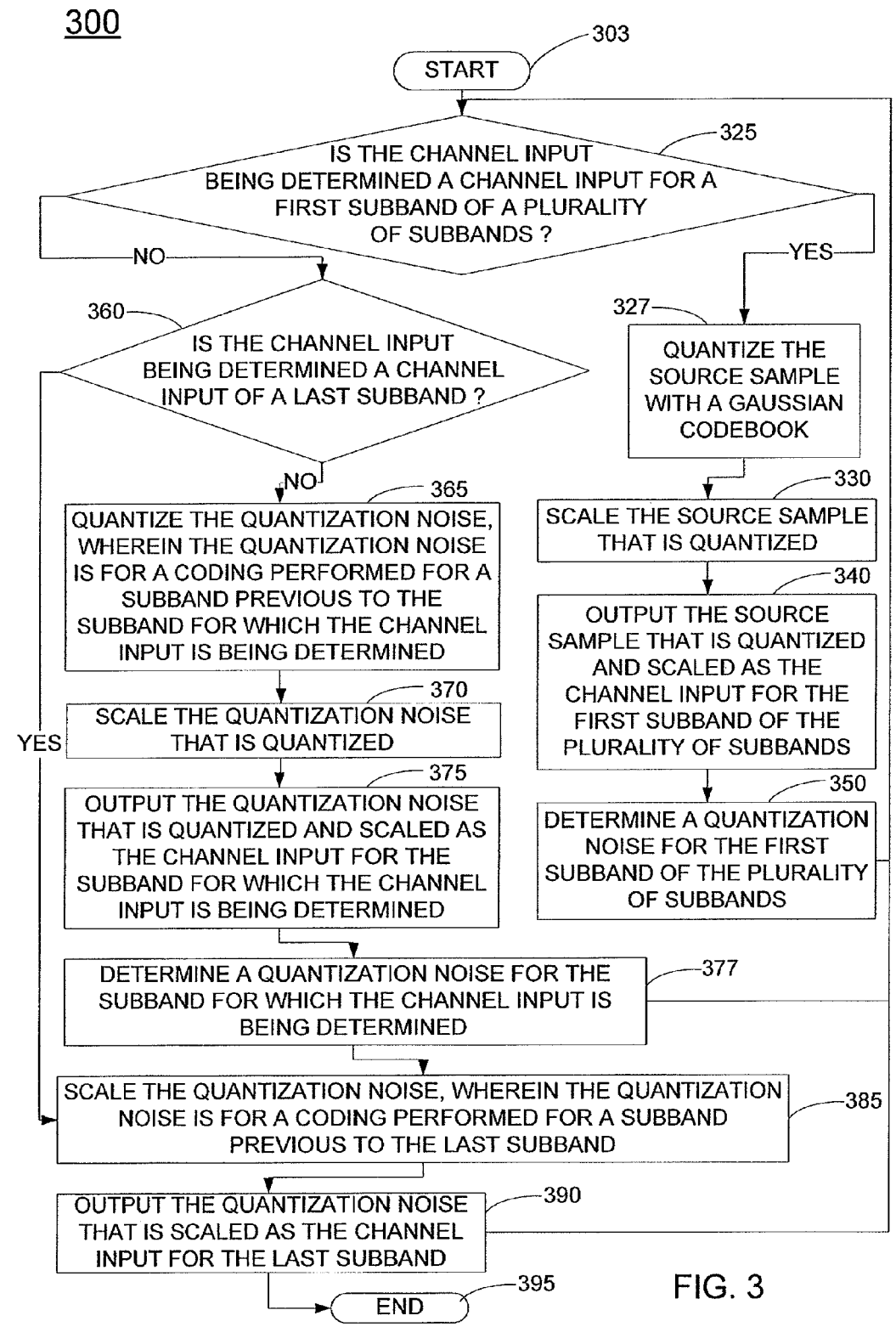
FIG. 3 illustrates a flowchart of a method for determining of a channel input for each of a plurality of subbands in accordance with a hybrid coding scheme.

FIG. 3 illustrates a flowchart of a method 300 for determining of a channel input for each of a plurality of subbands in accordance with the hybrid coding scheme. For example, the method 300 may be used in step 217 of FIG. 2 to recursively determine the channel input for each of the plurality of subbands. Method 300 starts in step 303 and proceeds to step 325.

In step 325, method 300 determines if the channel input being determined is a channel input for a first subband of a plurality of subbands. If the channel input being determined is for the first subband, the method proceeds to step 327. Otherwise, the method proceeds to step 360.

In step 327, method 300 quantizes a source sample with a Gaussian codebook. For example, the method quantizes an analog source sample to obtain a digital quantized source sample using a Gaussian codebook.

In step 330, method 300 scales the source sample that is quantized. In one embodiment, the scaling of the source sample that is quantized is performed by matching a power level of the source sample that is quantized to a power level of the channel. For example, the source sample that is quantized is scaled such that the scaled version of the source sample that is quantized has a power level that matches the power level of the channel.

In step 340, method 300 output the source sample that is quantized and scaled as the channel input for the first subband of the plurality of subbands. The channel input for the first subband may then be transmitted as the channel input over the network, as described in step 219 of FIG. 2.

In step 350, method 300 determines a quantization noise for the first subband of the plurality of subbands. For example, the method determines the source quantization noise for the first subband as the difference between the source sample and the source sample that is quantized (e.g., as derived above in step 327). The method proceeds to step 325.

In step 360, method 300 determines if the channel input being determined is a channel input of a last subband. Thus, steps 325 and 360 effectively determine a position of a particular subband relative to the plurality of subbands. If the channel input being determined is that of the last subband, the method proceeds to step 385. Otherwise, the method proceeds to step 365. For example, if the channel input being determined is for the b-th subband, the method proceeds to step 385. If the channel input being determined is for the subbands 2, 3, . . . , b−1, the method proceeds to step 365.

In step 365, method 300 quantizes the quantization noise, wherein the quantization noise is for a coding performed for a subband previous to the subband for which the channel input is being determined. For example, in order to determine the channel input for the second subband, the method quantizes the quantization noise for the coding performed for the first subband using a Gaussian codebook. In another example, if the channel input being determined is the channel input for the (b−1)-th subband, the method quantizes the quantization noise from the coding performed for the (b−2)-th subband.

In step 370, method 300 scales the quantization noise that is quantized, wherein the quantization noise is for a coding performed for a subband previous to the subband for which the channel input is being determined. For example, the quantization noise that is quantized in step 365 is scaled such that the power level matches the power level of the channel.

In step 375, method 300 outputs the quantization noise that is quantized and scaled as the channel input for the subband for which the channel input is being determined. The channel input that is outputted may then be transmitted on the particular subband over the network, as described in step 219 of FIG. 2.

In step 377, method 300 determines a quantization noise for the subband for which the channel input is being determined (i.e., the current subband). For example, the method determines the quantization noise for the current subband as the difference between the quantization noise for coding performed for the subband previous to the current subband and the quantization noise that is quantized, as described above in step 365. For example, the quantization noise for the $3^{rd}$ subband is determined as follows: first, the coding performed for transmission on the $2^{nd}$ subband is retrieved. The retrieved quantization noise is quantized as described in step 365. Then, the difference between the quantization noise that is retrieved and the quantized version is determined. The difference that is determined is then the quantization noise for the $3^{rd}$ subband. The method proceeds to step 325 where the process is performed iteratively for a plurality of subbands.

In step 385, method 300 scales the quantization noise, wherein the quantization noise is for a coding performed for a subband previous to the subband for which the channel input is being determined. For the last subband (b-th subband), the method directly scales the quantization noise from the codeword of the (b−1)-th subband and uses the scaled quantization noise as an input for the last subband, without further quantizing.

In step 390, method 300 outputs the quantization noise that is scaled as the channel input for the subband for which the channel input is being determined. For example, the method outputs the scaled version of the quantization noise for the coding performed for transmission on the (b−1)-th subband as the channel input for the last subband (b-th subband). The channel input that is outputted may then be transmitted as the channel input for the last subband over the network, as described in step 219 of FIG. 2. The method either proceeds to step 325 to continue determining channel inputs or to step 395 to end the current process.

Note that in one embodiment, an encoder and a decoder are used at both locations. For example, the transmission system of FIG. 1 may be a bidirectional transmission system. In one embodiment, the encoder and decoder may be integrated in one device.

It should be noted that although not explicitly specified, one or more steps of the methods 200 or 300 described herein may include a storing, displaying and/or outputting step as required for a particular application. In other words, any data, records, fields, and/or intermediate results discussed in the method can be stored, displayed, and/or outputted to another device as required for a particular application. Furthermore, steps or blocks in FIG. 2 or FIG. 3 that recite a determining operation, or involve a decision, do not necessarily require that both branches of the determining operation be practiced. In other words, one of the branches of the determining operation can be deemed as an optional step.

Figure 4:
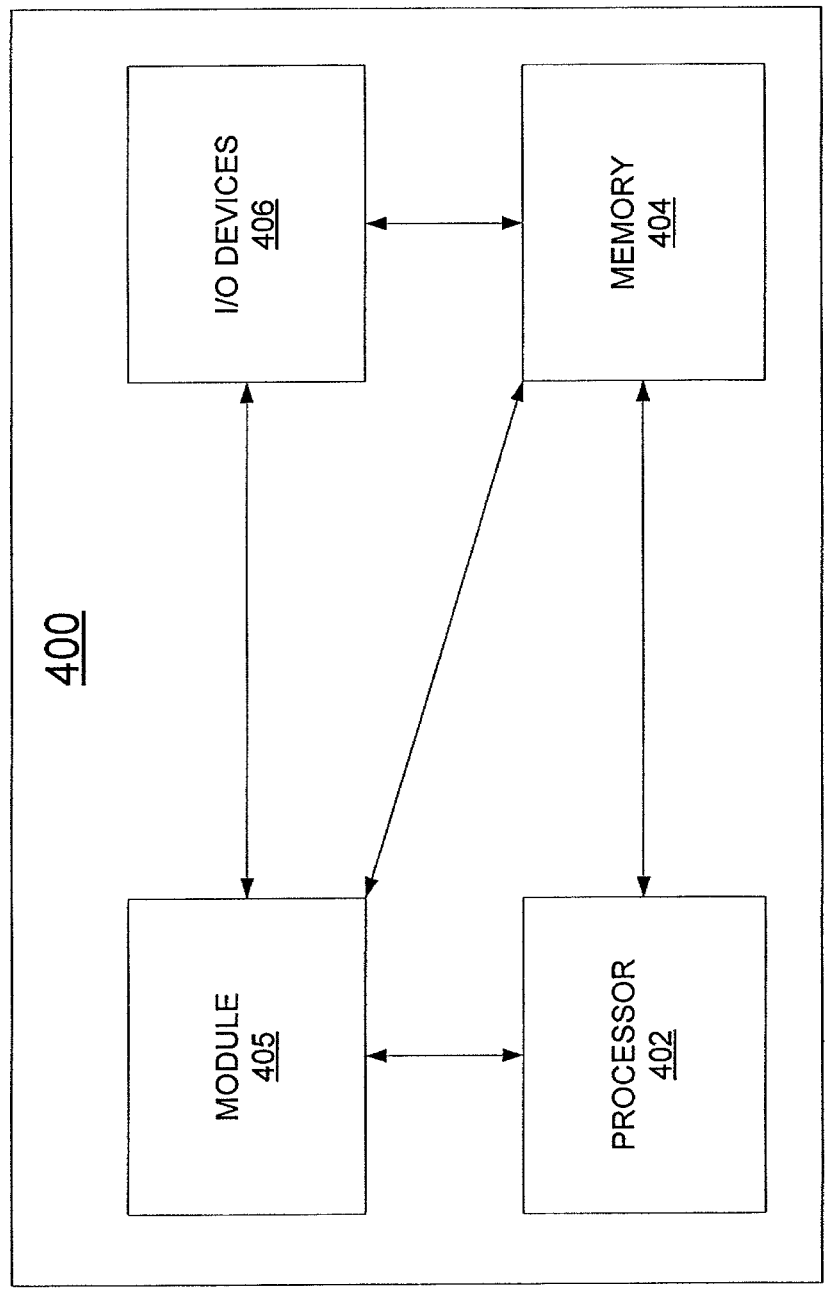
FIG. 4 illustrates a high level block diagram of a general purpose computer suitable for use in performing the functions described herein.

FIG. 4 depicts a high level block diagram of a general purpose computer suitable for use in performing the functions described herein. As depicted in FIG. 4, the system 400 comprises a hardware processor element 402 (e.g., a CPU), a memory 404, e.g., random access memory (RAM) and/or read only memory (ROM), a module 405 for providing transmission of data on a bandwidth mismatched channel, and various input/output devices 406 (e.g., storage devices, including but not limited to, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

It should be noted that the present disclosure can be implemented in software and/or in a combination of software and hardware, e.g., using application specific integrated circuits (ASIC), a general purpose computer or any other hardware equivalents, e.g., computer readable instructions pertaining to the method(s) discussed above can be used to configure a hardware processor to perform the steps of the above disclosed method. In one embodiment, the present module or process 405 for providing transmission of data on a bandwidth mismatched channel can be loaded into memory 404 and executed by hardware processor 402 to implement the functions as discussed above. As such, the present process 405 for providing transmission of data on a bandwidth mismatched channel (including associated data structures) of the present disclosure can be stored on a non-transitory (e.g., tangible and physical) computer readable storage medium, e.g., RAM memory, magnetic or optical drive or diskette and the like. For example, the processor 402 can be programmed or configured with instructions (e.g., computer readable instructions) to perform the steps of methods 200 and 300.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   determining, by a processor, a ratio of a number of channel uses of a channel in a network to a number of source samples, wherein the number of channel uses refers to an ability of the channel to transmit the source samples;
   dividing, by the processor, a channel bandwidth into a plurality of subbands of equal bandwidth in accordance with the ratio;
   receiving, by the processor, a source sample block;
   determining, by the processor, a channel input for each of the plurality of subbands from the source sample block in accordance with a hybrid coding scheme, wherein the determining the channel input for a particular subband of the plurality of subbands, comprises:
      determining a position of the particular subband relative to the plurality of subbands;
      quantizing a first quantization noise, wherein the first quantization noise is for a coding performed for a subband previous to the particular subband for which the channel input is being determined, when the particular subband is not a first subband of the plurality of subbands and the particular subband is not a last subband of the plurality of subbands;
      scaling the first quantization noise that is quantized, when the particular subband is not the first subband of the plurality of subbands and the particular subband is not the last subband of the plurality of subbands;
      outputting the first quantization noise that is quantized and scaled as the channel input for the particular subband for which the channel input is being determined; and
      determining a second quantization noise for the particular subband for which the channel input is being determined; and
   transmitting, by the processor, for each of the plurality of subbands, the channel input that is determined over the network to a decoder that reconstructs the source sample block using the channel input for the each of the plurality of subbands.

2. The method of claim 1, wherein the ratio is a bandwidth expansion factor that has an integer value that is greater than one.

3. The method of claim 1, wherein the channel input for each of the plurality of subbands is scaled such that a power level of the channel input matches a power level of the channel.

4. A non-transitory computer-readable medium storing a plurality of instructions, which when executed by a processor, cause the processor to perform operations comprising:
   determining a ratio of a number of channel uses of a channel in a network to a number of source samples, wherein the number of channel uses refers to an ability of the channel to transmit the source samples;
   dividing a channel bandwidth into a plurality of subbands of equal bandwidth in accordance with the ratio;
   receiving a source sample block;
   determining a channel input for each of the plurality of subbands from the source sample block in accordance with a hybrid coding scheme, wherein the determining the channel input for a particular subband of the plurality of subbands, comprises:
      determining a position of the particular subband relative to the plurality of subbands;
      quantizing a first quantization noise, wherein the first quantization noise is for a coding performed for a subband previous to the particular subband for which the channel input is being determined, when the particular subband is not a first subband of the plurality of subbands and the particular subband is not a last subband of the plurality of subbands;
      scaling the first quantization noise that is quantized, when the particular subband is not the first subband of the plurality of subbands and the particular subband is not the last subband of the plurality of subbands;
      outputting the first quantization noise that is quantized and scaled as the channel input for the particular subband for which the channel input is being determined; and
      determining a second quantization noise for the particular subband for which the channel input is being determined; and
   transmitting, for each of the plurality of subbands, the channel input that is determined over the network to a decoder that reconstructs the source sample block using the channel input for the each of the plurality of subbands.

5. The non-transitory computer-readable medium of claim 4, wherein the ratio is a bandwidth expansion factor that has an integer value that is greater than one.

6. The non-transitory computer-readable medium of claim 4, wherein the channel input for each of the plurality of subbands is scaled such that a power level of the channel input matches a power level of the channel.

7. An apparatus, comprising:
   a processor; and
   a computer-readable medium storing a plurality of instructions which, when executed by the processor, cause the processor to perform operations, the operations comprising:
      determining a ratio of a number of channel uses of a channel in a network to a number of source samples, wherein the number of channel uses refers to an ability of the channel to transmit the source samples;
      dividing a channel bandwidth into a plurality of subbands of equal bandwidth in accordance with the ratio;
      receiving a source sample block;
      determining a channel input for each of the plurality of subbands from the source sample block in accordance with a hybrid coding scheme, wherein the determining the channel input for a particular subband of the plurality of subbands, comprises:
         determining a position of the particular subband relative to the plurality of subbands;
         quantizing a first quantization noise, wherein the first quantization noise is for a coding performed for a subband previous to the particular subband for which the channel input is being determined, when the particular subband is not a first subband of the plurality of subbands and the particular subband is not a last subband of the plurality of subbands;
         scaling the first quantization noise that is quantized, when the particular subband is not the first subband of the plurality of subbands and the particular subband is not the last subband of the plurality of subbands;
         outputting the first quantization noise that is quantized and scaled as the channel input for the particular subband for which the channel input is being determined; and
         determining a second quantization noise for the particular subband for which the channel input is being determined; and transmitting, for each of the plurality of subbands, the channel input that is determined over the network to a decoder that reconstructs the source sample block using the channel input for the each of the plurality of subbands.

8. The apparatus of claim 7, wherein the factor has an integer value that is greater than one.

9. The apparatus of claim 7, wherein the channel input for each of the plurality of subbands is scaled such that a power level of the channel input matches a power level of the channel.

\* \* \* \* \*